United States Patent [19]

Blok

[11] Patent Number: 4,723,458

[45] Date of Patent: Feb. 9, 1988

[54] CONTROL MECHANISM

[75] Inventor: Petrus Blok, Moerkapelle, Netherlands

[73] Assignee: N.V. Industrie-en Handelmaatschappi, Waddinxveen, Netherlands

[21] Appl. No.: 902,319

[22] Filed: Aug. 29, 1986

[51] Int. Cl.[4] .................. G05G 9/02; H01L 43/06; F15B 5/00

[52] U.S. Cl. .................. 74/471 XY; 137/82; 137/636; 200/6 A; 335/207

[58] Field of Search ............ 74/471 XY; 137/82, 636; 200/6 A; 335/206, 207; 273/148 B

[56] References Cited

U.S. PATENT DOCUMENTS

| | | | |
|---|---|---|---|
| 3,290,455 | 12/1966 | Christensen | 200/6 A |
| 3,828,148 | 8/1974 | Roeser | 200/6 A |
| 4,181,827 | 1/1980 | Diepeveen | 200/6 A |
| 4,187,483 | 2/1980 | Whitney | 335/206 |
| 4,382,166 | 5/1983 | Kim | 273/148 B X |
| 4,434,412 | 2/1984 | Ruumpol | 336/134 |
| 4,458,226 | 7/1984 | Cho | 273/148 B X |
| 4,459,578 | 7/1984 | Sava et al. | 338/32 H X |
| 4,489,303 | 12/1984 | Martin | 338/128 |
| 4,519,266 | 5/1985 | Reinecke | 74/471 X |
| 4,646,087 | 2/1987 | Schumann | 74/471 XY |

FOREIGN PATENT DOCUMENTS

| | | | |
|---|---|---|---|
| 463581 | 7/1928 | Fed. Rep. of Germany | 200/6 A |
| 2062801 | 6/1972 | Fed. Rep. of Germany | 137/636 |
| 8002727 | 12/1981 | Netherlands . | |
| 8201102 | 10/1983 | Netherlands . | |

*Primary Examiner*—Allan D. Herrmann

*Attorney, Agent, or Firm*—Arthur B. Colvin

[57] ABSTRACT

A control mechanism comprising a casing, an operating lever (1) projecting at the top from the casing and arranged to swivel omnidirectionally against a spring-produced resetting force, and at least two transducers arranged according to two orthogonal axes for producing signals being a measure for the magnitude of the swivelling angle and for the swivelling direction of the operating lever (1).

The operating lever (1) is mounted near its lower end in a ball joint (2) received in the upper wall of the casing, with the free lower end of the lever (1) abutting on four spring elements (3,6,9,12) whose lines of action (X,Y) coincide two by two intersect each other at right angles. The spring elements (3,6,9,12) are connected at the lower end of the operating lever (1) to downwardly extending oscillating or wagging plates (5,8,11,14) whose ends (A,B), upon swivelling movement of lever (1), are displaced inwardly in the direction of the axis of the casing. The magnitude of this displacement is a measure for the swivelling angle and the swivelling direction of lever (1).

10 Claims, 16 Drawing Figures

1
2
3
4
5
6
7
8
9
10
11
12
13
14
15
16
17
18
29
30
31
32
33
34
35
36
37
A
B
C
X
Y

CONTROL MECHANISM

The present invention relates to a control mechanism comprising a casing, an operating lever projecting at the top from the casing, and arranged to swivel omnidirectionally against a spring-produced resetting force, and at least two transducers arranged according to two orthogonal axes for producing signals being a measure for the magnitude of the swivelling angle and for the swivelling direction of the operating lever.

A similar control mechanism is known from Dutch patent application No. 80,02727. The operating lever is connected to the casing through a helical spring whose line of action coincides with the axis of the operating lever. A coil connected to an AC voltage source is disposed concentrically with the operating lever in the neutral position, while four inductive transducers are connected to the casing, said transducers being arranged at mutual angular distances of 90°. As the pivot point of the operating lever is below the coil, said coil should have a relatively large diameter to enable the operating lever to make a certain stroke or deflection. The inductive transducers are disposed above the coil and should therefore be placed still further outwardly in radial sense, which renders this known control mechanism relatively bulky and moreover relatively heavy when of robust construction. The pivot of the operating lever formed by a helical spring, it is true, provides a resetting force which will return the operating lever to its neutral position when it is released, but the resetting forces produced by the helical spring are independent of the direction wherein the lever has been swivelled.

It is an object of the present invention to provide a control mechanism of the above described type wherein the resetting force acting on the operating lever has a given magnitude upon movement of the lever in the direction of an orthogonal pair of axes and a larger resetting force when the lever is swivelled in a direction other than the main directions formed by said pair of axes. The control mechanism should also be robust, occupy a small volume and have a light weight in connection with its use in portable controls.

The control mechanism should further be adapted for use with transducers of different types and e.g. for producing hydraulic control pressures.

The control mechanism according to the present invention is characterized to that end in that the operating lever is mounted near its lower end in a ball joint received in the upper wall of the casing, with the free lower end of the lever abutting on four spring elements whose lines of action coincide two by two and intersect each other at right angles, said spring elements being connected at the lower end of the operating lever to downwardly extending oscillating or wagging plates, whose ends upon swivelling movement of the lever move inwardly in the direction of the axis of the casing, the magnitude of this movement being a measure for the swivelling angle and the swivelling direction of the lever.

Since the end of the operating lever is received between four spring elements, when the lever moves in a direction coinciding with the orthogonal main axes, a resetting force will be produced by only one of the spring elements with two other, opposing spring elements ensuring a guidance of the free end of the lever. Upon swivelling movement of the lever in a direction deviating from either of the main directions, two spring elements are displaced, which produces an enlarged resetting force in the direction of the neutral position. Since, moreover, the lower ends of the oscillating plates, upon swivelling motion of the lever, move inwardly, the signal-producing elements of the transducers can be accommodated in the central portion of the casing, which results in both a volume reduction and a saving in weight for the control mechanism. The oscillating plates can be employed with signal-producing elements of different types, they can be used e.g. as vanes for vane-regulated nozzle systems, so that the control mechanism can also be used for directly producing hydraulic control pressure signals.

It is observed that Dutch patent application No. 82,01102 discloses a control mechanism comprising an operating lever mounted near its lower end in a casing by means of a ball joint, with the coil and the inductive transducers being disposed underneath the ball joint and hence being responsive to a deflection in radial sense of the free lower end of the lever. Above the ball joint there is provided a helical spring about a slidable bearing bush whose lower end has a concave surface which, upon swivelling movement of the lever, is displaced over a spherical head, resulting in that the helical spring is depressed, which produces a resetting force for the lever. Said resetting force, however, is direction-independent. In this construction too, the coil arranged concentrically with the lever and connected to an AC voltage source, as well as the inductive transducers have to be mounted outside the swivelling range of the free lower end of the coil, so that the above drawbacks going with the operating mechanism according to Dutch application No. 80,02727 continue to be present.

Some embodiments of the control mechanism according to the present invention will now be described, by way of example, with reference to the accompanying drawing, in which:

FIG. 1 is a cross-section of the control mechanism;

FIG. 2*a–e* shows different views of embodiments of the oscillating plates;

FIG. 3 is a cross-section similar to FIG. 1 showing a control mechanism with the operating lever being swivelled out of its neutral position;

FIGS. 4–5*a* are cross-sections similar to FIGS. 1, 3, wherein the control mechanism includes signal-producing elements;

Figure 3:
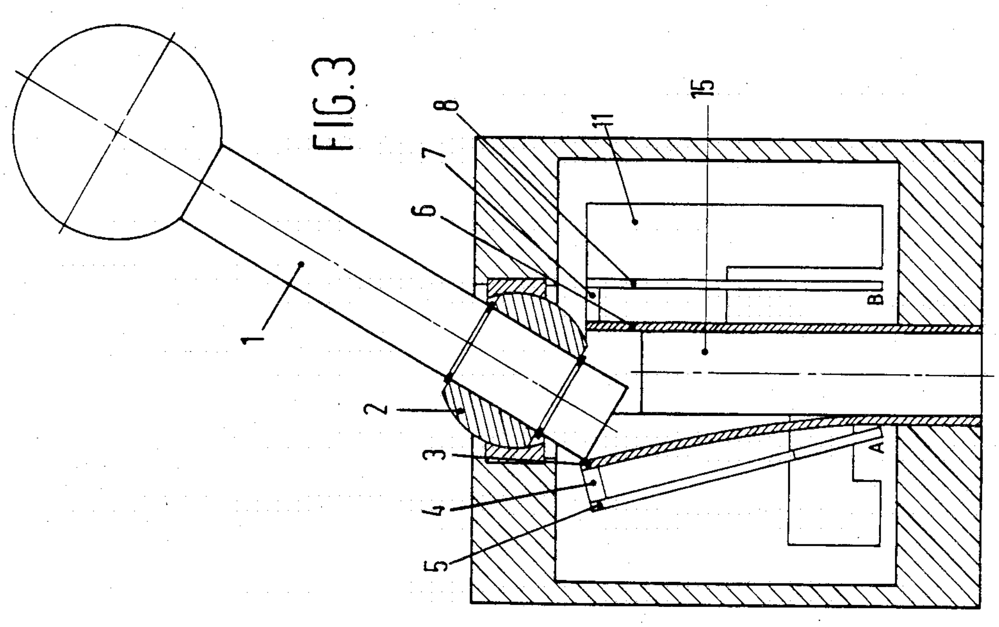
Figure 1:
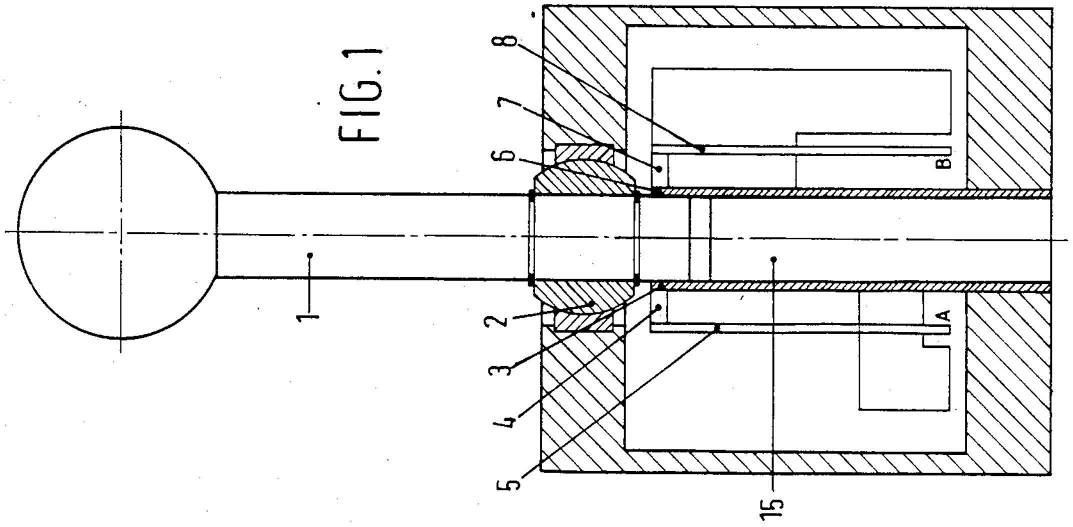

In the cross sectional view of the control mechanism according to FIG. 1, the operating lever 1 is shown in the neutral position. Lever 1 swivels in a ball joint 2 disposed in the upper wall of the casing. The free lower end of the lever 1, upon a movement perpendicular to the plane of drawing, is guided by two leaf springs 3,6. Upon movement in the plane of drawing, the free lower end of the lever 1 is guided by the leaf springs 9, 12 shown in top view in FIG. 2*a.* Upon movement in the plane of drawing, leaf spring 3, 6 is bent, as shown for leaf spring 3 in FIG. 3. Leaf spring 3 is subjected, at the point of contact with the free lower end of lever 1, to a linear displacement, as well as to an angular displacement. This angular displacement is transmitted to the oscillating plate 5, which is connected by means of connector 4 to leaf spring 3, at the top and results in the lower, cantilever end A of the oscillating plate to be displaced in the direction of the axis of the operating lever. This displacement can be used as, or be converted into, a control signal, as will be further explained hereinafter.

Leaf springs 3, 6, 9, 12 are mounted in a biased or prestress condition, e.g. clamped in the bottom of the casing. When lever 1 is in the neutral position, the upper edges of the leaf springs abut on the free lower end of the operating lever, while the central portion of the leaf springs abuts on a fixed stop 15.

Figures 2A, 2B, 2C, 2D, 2E, 6:
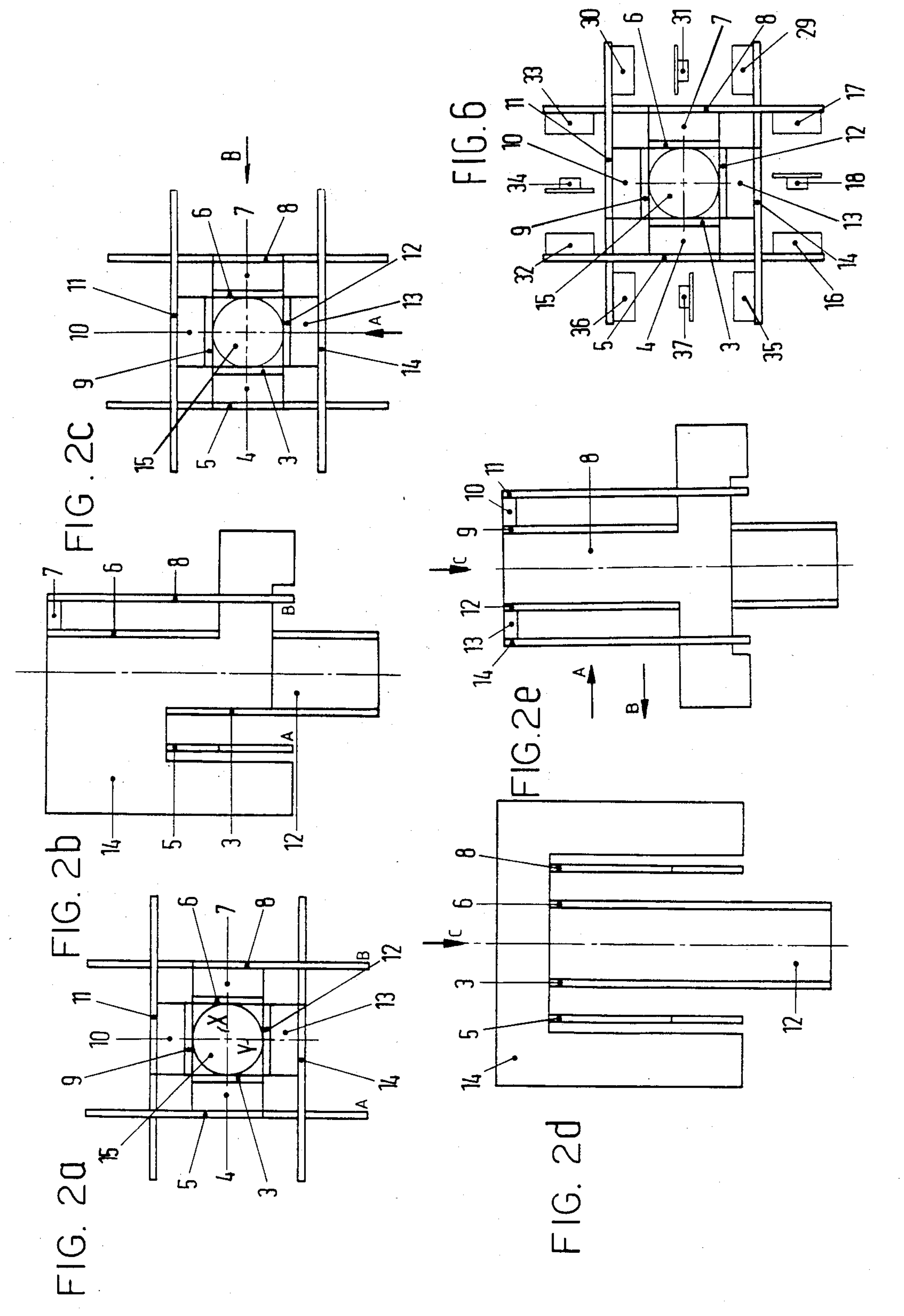
FIG. 6 is a view of the oscillating plates according to FIG. 2*a,* with double signal-producing elements.

FIG. 2 shows different embodiments of the osicllating plates. FIG. 2a shows a top view of the leaf spring-/oscillating plate construction, the leaf springs 3, 6, 9, 12 being connected through connectors 4, 7, 10, 13 to oscillating plates 5, 8, 11, 14. X and Y indicate the main axes. Since the lower ends of the oscillating plates, upon swivelling movement of the operating lever, move inwardly, the oscillating plates should have such a form that their inward movement is not hindered by adjoining oscillating plates arranged in other directions. This can be achieved by imparting to the oscillating plate a form as shown in the front view of FIG. 2*b*. Oscillating plate 14, connected to leaf spring 12, has a right half whose shape can be defined as a longitudinally divided, reversely mounted T, whereas the left half of oscillating plate 14 has the shape of a longitudinally divided, reversely mounted U. The separated lower ends of plate 14 can move perpendicularly to the plane of drawing, during which movement they are not hindered by the lower end A of plate 5 or by the lower end B of plate 8, movable in the plane of drawing in the direction of the axis shown in FIG. 2*b*. In this embodiment, all oscillating plates have the same external shape. They are connected in offset relationship through 90° to the respective leaf springs 3, 12, 6, 9.

FIGS. 2*c*–2*e* show a different possible embodiment of the oscillating plates. Plates 14 and 11 have a U-shape connected, in reverse condition, by its transverse leg to the associated leaf spring 12, 9. The two other oscillating plates 5, 8 have a T-shape connected upside down to the associated leaf springs 3, 6. In this embodiment, the oscillating plates are identical only two by two. The lower ends of the plates, however, upon swivelling movement of the operating lever, can move inwardly unimpededly.

Figure 5:
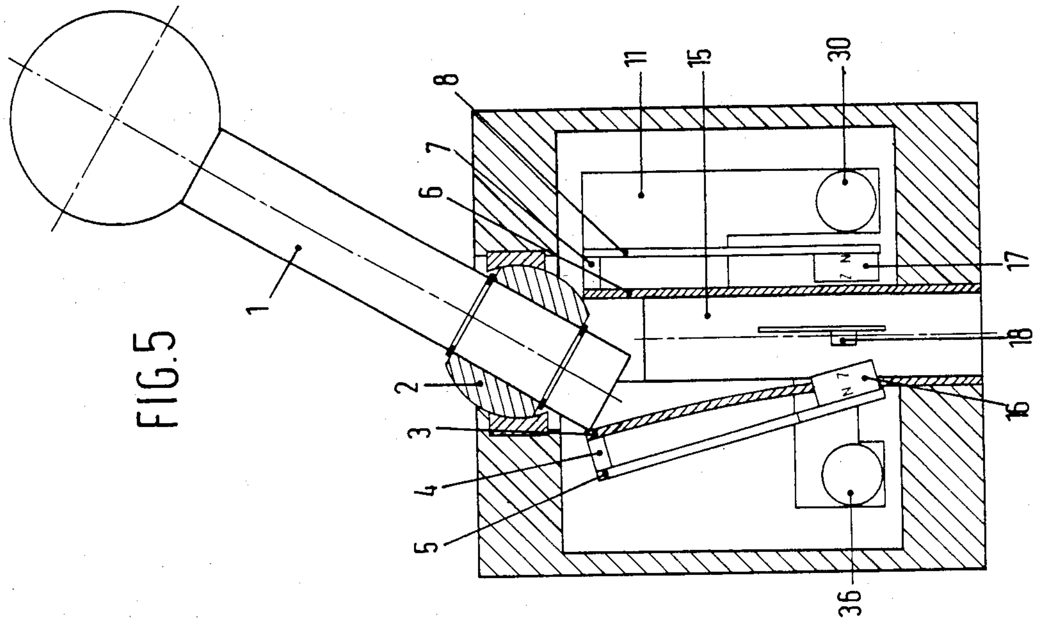
Figure 4:
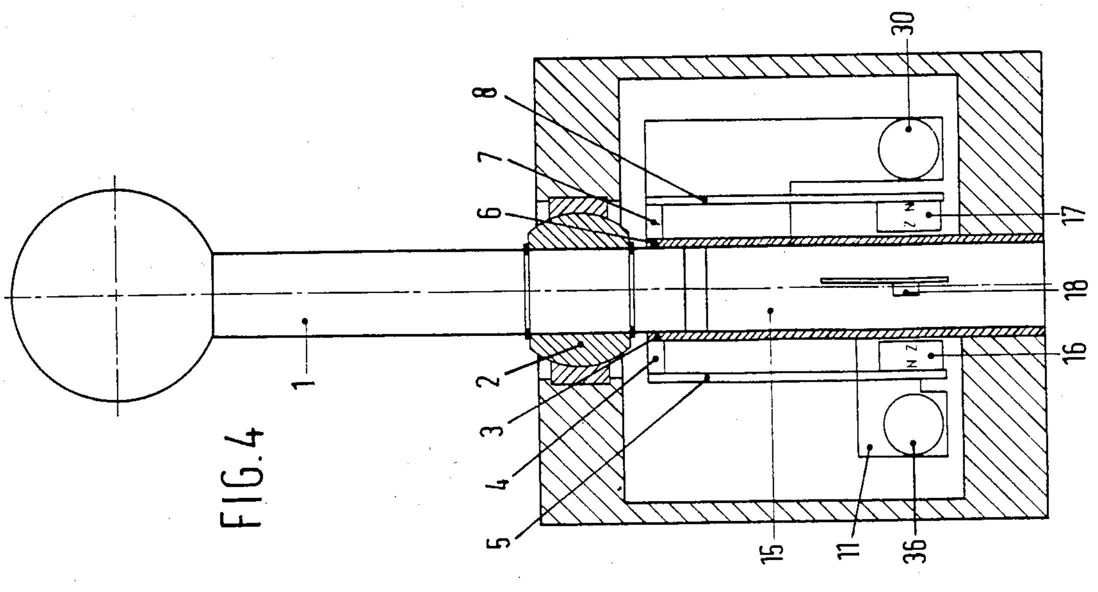

FIGS. 4, 5, **5*a* show how an electric control signal can be produced with the control mechanism shown in FIG. 1. Mounted on the ends A and B of oscillating plates 5, 8 are magnets 16, 17, with the similar magnetic poles facing one another, so that centrally between plates 5, 8 there prevails a magnetically neutral field when the lever 1 is in the position shown in FIG. 4. In the neutral central plane there is positioned a Hall effect transducer 18. Such a transducer 18 can produce an electric voltage proportional to the magnetic field present perpendicular to transducer 18. By swivelling lever 1, either of the magnets 16 or 17 can move in the direction of transducer 18 (see FIG. 5), with the direction of the magnetic field adjacent the transducer being defined by the direction of movement of lever 1 and the magnitude of the magnetic field being a function of the magnitude of the displacement of lever 1** in a main direction X or Y.

Such a combination of two magnets and a transducer 18 is also provided on wagging plates 11 and 14. FIGS. 4 and 5 show the magnets mounted on wagging plate 11 at reference numerals 30, and 36, respectively. Upon swivelling movement of operating lever 1 in a random direction, two electric signals are produced, each being proportional to a component of the displacement of the operating lever in either of the main directions X, Y.

In principle, it is sufficient when two transducers 18 are provided, i.e. one in the X-plane and one in the Y-plane. In that case, only one magnet need be mounted on each oscillating plate, naturally in such a manner that the magnets of two opposed oscillating plates are located on opposite sides of transducer 18. For obtaining a greater reliability, two transducers can be arranged in each main plane X or Y, as shown in top view in FIG. 6. The four transducers 18, 31, 34, 37 are offset relatively to each other through 90° and placed between magnets 16,17; 29,30; 33,32; 36,35. The form of the oscillating plates is identical to that shown in FIGS. 2*a*, 2*b*. To improve the cooperation between magnets 16, 17 and the intermediate Hall effect transducer 18, it is desirable for the plates 5, 8 to be given a slight outward bend directly above magnets 16, 17 (see FIG. 5A).

Figure 7:
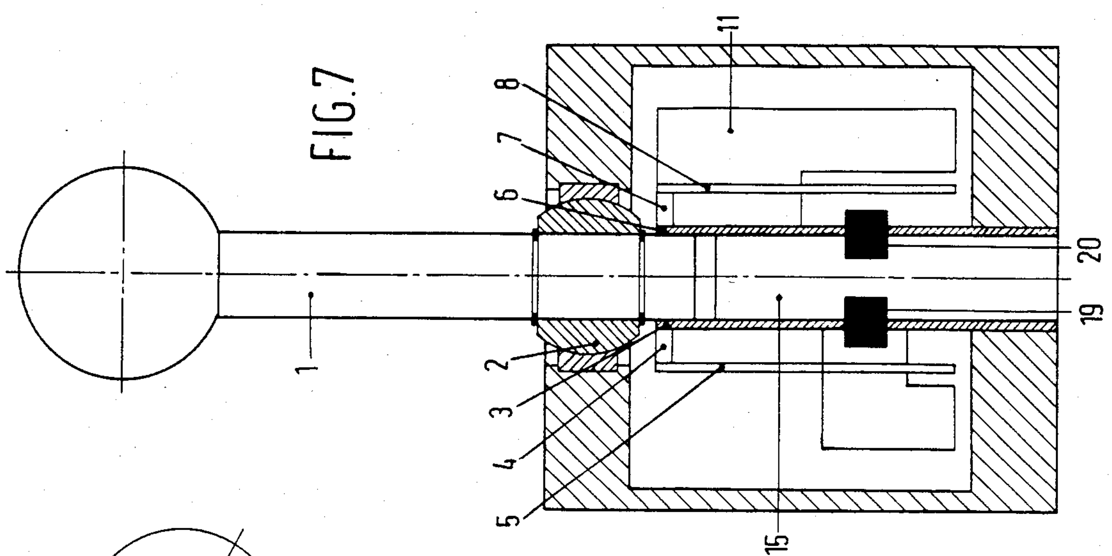
FIGS. 7–8 show a variant of the control mechanism including inductive transducers as signal-producing elements.
Figure 8:
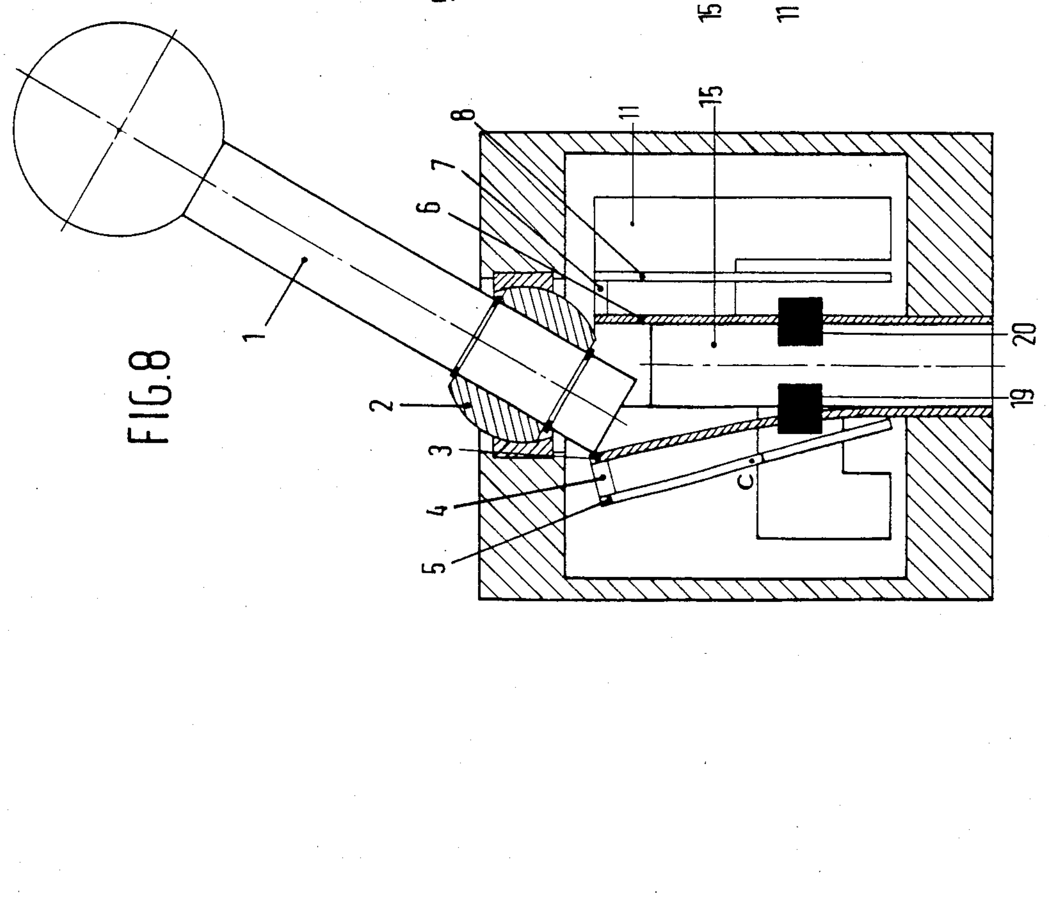

FIGS. 7–8 show a control mechanism similar to FIGS. 4–5, with the difference that other means are used for producing the electric control signal. In this embodiment, the position of an oscillating plate is sensed contactlessly by means of inductive transducers 19, 20. In the central position of lever 1, the inductive transducers 19, 20 are equidistant from the associated oscillating plates 5, 8. The differential between the signals produced by transducers 19, 20 is therefore 0. When, through a displacement of lever 1, plate 5 is moved in the direction of transducer 19 (see FIG. 8), the electric output signal of inductive transducer 19 will change. The differential of the output signals of transducers 19, 20 is a function of the displacement of lever 1. Here too, maximally 8 transducers can be positioned in a manner as shown in FIG. 6. The minor displacements desired for such inductive transducers 19, 20 can be realized in a simple manner by placing the transducer in proximity to the virtual pivot point C of plate 5.

The contactless measurement is not essential for the control mechanism according to the present invention. Other position transducers affixed to the oscillating plate may also be employed.

Figure 9:
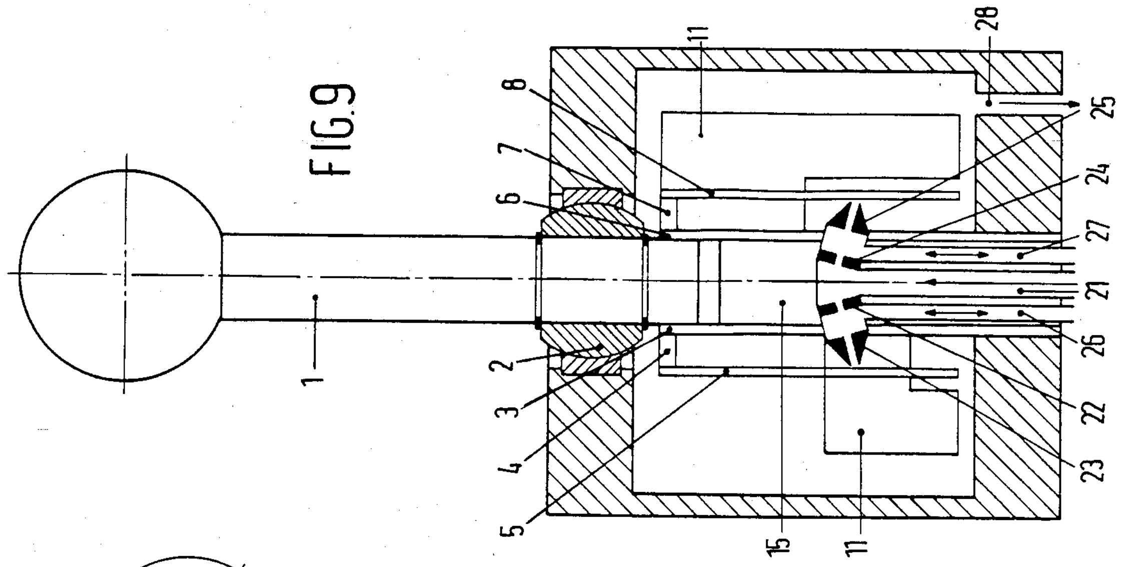
FIGS. 9–10 show a variant of the control mechanism having pneumatic/hydraulic transducers and FIG. 11 shows a variant of the control mechanism according to FIG. 1, with different oscillating plates and spring elements.
Figure 10:
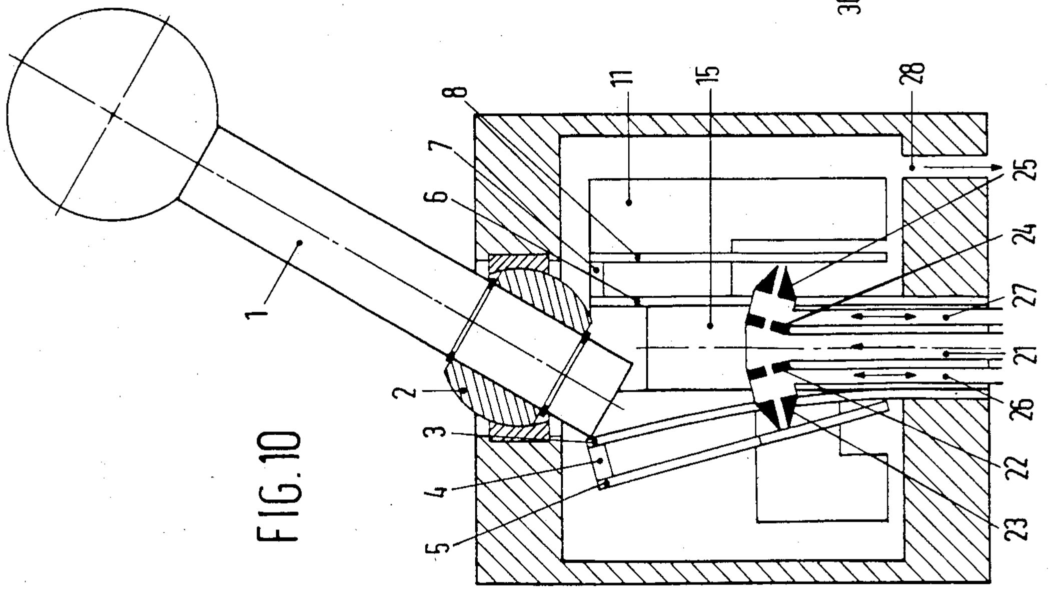

For obtaining a pneumatic or hydraulic control pressure, the oscillating plate can be used as a vane in a known per se system of vane-regulated nozzles shown in FIGS. 9–10. Through supply line 21 a medium, e.g. oil or air, flows via fixed restrictions 22, 24 to nozzles 23, 25 and subsequently via a discharge line 28 back to the pressure source, e.g. a pump. Nozzles 23, 25, together with plates 5, 8, form a variable resistance. When plate 5 moves in the direction of nozzle 23 (see FIG. 10), the outflow resistance of nozzle 24 will rise and the pressure between fixed restriction 22 and nozzle 23 will increase, whereas the pressure between fixed restriction 24 and nozzle 25 remains constant. Consequently, the pressure in control line 26 will be higher than the pressure in control line 27. The pressure differential between the two control lines 26, 27 again forms a function of the displacement of lever 1 in a main direction, in this case a main direction located in the plane of drawing. Here too, in accordance with the arrangement of the magnets in FIG. 6, maximally 8 nozzles can be arranged in the system. The arrangement of nozzles 23, 25 in FIGS. 9–10 also constitutes an example of the possibility of compensating for the effect of the angular displacement of the oscillating plate by positioning the measuring element at a suitable angle. As shown in FIG. 10, the oscillating plate 5, in extreme position shown is parallel to the front of nozzle 23, which is therefore entirely shut off in this position by plate 5.

Figure 11:
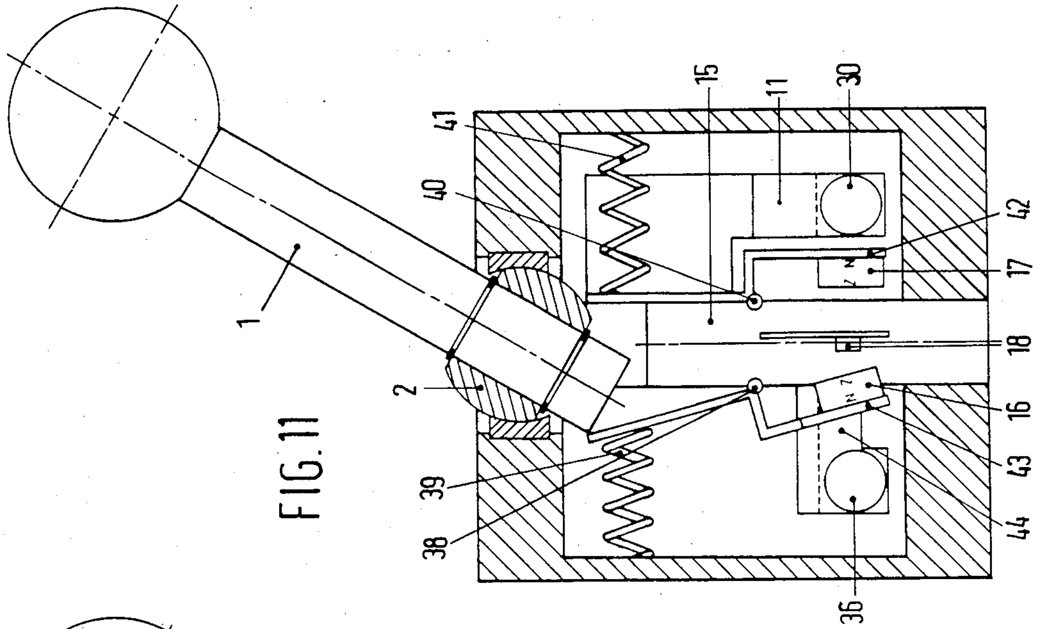

Finally, FIG. 11 shows a variant of the control mechanism differing from the above described embodiment substantially in that the end of the lever 1 is received between helical springs instead of between leaf springs. FIG. 11 shows helical springs 39, 41 whose line of action is perpendicular to the axis of lever 1 in the neutral position. It will be clear that there are also two helical springs whose line of action coincides with the other main axis, being perpendicular to the plane of drawing. Owing to the use of helical springs 39, 41, oscillating plates 43, 42 should have a different shape; they are Z-shaped to prevent the lower end of the oscillating plate from contacting transducer 18 upon swivelling motion of lever 1. Plates 42, 43 are pivotally mounted in the casing about pivots 40 and 38, respectively. Magnets 16, 17 are mounted on the ends of plates 43, 42. Naturally, this system can be fitted also with other signal-producing elements. Shown at 44 is a different oscillating plate, which is located at the back of stop 15. This plate 44 is fitted with magnets 30, 36.

The lower end of the operating lever, being cylindrical in the above described embodiment, can also have a different shape, e.g., for obtaining a given, desired relation between the displacement of said end of the lever 1 and the control signal produced thereby. In this manner, for instance a control signal varying according to a linear function is obtained. Instead of being cylindrical, the lower end of the lever may have a square cross section, with or without rounded or bevelled corners, or it may be conical, spherical or have intermediate forms thereof, depending on the shape of the oscillating or wagging plate, the chosen form for the signal-producing portion of the transducer and its position.

I claim:

1. A control mechanism comprising a casing, an operating lever projecting at the top from the casing and arranged to swivel omnidirectionally against a spring-produced resetting force, and at least two transducers arranged according to two orthogonal axes for producing signals being a measure for the magnitude of the swivelling angle and for the swivelling direction of the operating lever, characterized in that said operating lever (1) is mounted near its lower end in a ball joint (2) received in the upper wall of the casing, with the free lower end of the lever (1) abutting on four spring elements (3,6,9,12) whose lines of action (X,Y) coincide two by two and intersect each other at right angles, said spring elements (3,6,9,12) being connected at the lower end of the operating lever (1) to downwardly extending oscillating or wagging plates (5,8,11,14) whose ends (A,B), upon swivelling movement of lever (1), are displaced inwardly in the direction of the axis of the casing, the magnitude of said displacement being a measure for the swivelling angle and the swivelling direction of said lever (1).

2. A control mechanism according to claim 1, characterized in that each spring element (3,6,9,12) comprises a leaf spring, the four leaf springs being fixed in the bottom plate of the casing and together forming a hollow sleeve.

3. A control mechanism according to claim 1, characterized in that each spring element is a helical spring (39,41) and the wagging plate (42,43) associated with each spring element has a Z-shape and between the two ends thereof is pivoted about a fixed point (38,40) (FIG. 11).

4. A control mechanism according to any one of claims 1–3, characterized in that two opposed wagging plates (11,14) have a U-shape whose cross beam is connected to the associated spring element (9,12) and whose two legs point downwardly, while the other two wagging plates (5,8) have a T-shape whose base is connected to the associated spring element (3,6) and whose cross beam forms the lower end, the arrangement being such that the cross beams of the T-shaped wagging plates (5,8) can move freely between the legs of the U-shaped wagging plates (11,14) (see FIG. 2*c*–*e*).

5. A control mechanism according to any one of claims 1-3, characterized in that all four wagging plates (5,8,11,14) have an identical form, the left half having the form of a longitudinally halved inverted U and the right half has the form of a longitudinally halved inverted T in such a manner that the ends of the four wagging plates can move freely with respect to each other (FIG. 2*a*–*b*).

6. A control mechanism according to claim 4, characterized in that on the ends of each two opposed wagging plates (5,8) there are provided permanent magnets (16,17) having similar poles facing one another, and a Hall effect transducer (18) is positioned between said magnets (16,17) in the central plane of the control mechanism.

7. A control mechanism according to claim 6, characterized in that on each wagging plate (5,8,11,14) there are positioned two permanent magnets (16,32; 17,33; 30,36; 29,35) on opposite sides of the axis of the operating lever (1), while likewise the number of Hall effect transducers (18,34; 31,37) is doubled per each direction of movement.

Figure 5A:
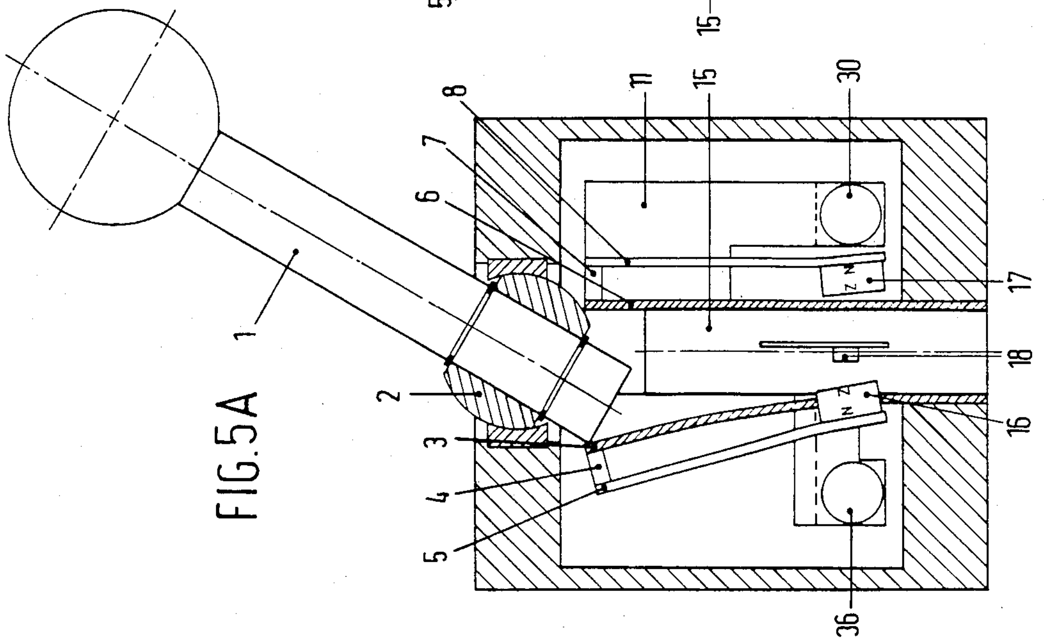

8. A control mechanism according to claim 6, characterized in that the magnets-carrying ends of the wagging plates are bent in a direction away from a central plane (FIG. 5*a*).

9. A control mechanism according to any one of claims 1–3, wherein inductive transducers are used, characterized in that said inductive transducers (19,20) are placed between the wagging plates (5,8) adjacent the virtual pivot point (C) thereof (FIG. 8).

10. A control mechanism according to any one of claims 1–3, characterized in that the casing is closed on all sides and is fitted with a discharge opening (28) for a hydraulic medium which can be supplied under pressure to the interior of the casing through a supply line (21) terminating in a nozzle system (22,25) having a double nozzle (23,25) directed towards an associated wagging plate (5,8) functioning as a vane in such a manner that, depending on the position of the wagging plate, a control pressure can be produced in a discharge line (26,27) (FIG. 10).

* * * * *

UNITED STATES PATENT OFFICE
CERTIFICATE OF CORRECTION

PATENT NO. : 4,723,458

DATED : February 9, 1988

INVENTOR(S) : Petrus Blok

It is certified that error appears in the above-identified patent and that said Letters Patent are hereby corrected as shown below:

In the patent, first page, line designated °(73), should be changed to read as follows:

--N.V. Industrie-en Handelmaatschappij "Koppen & Lethem" Waddinxveen, Netherlands--

Signed and Sealed this

Twelfth Day of July, 1988

*Attest:*

DONALD J. QUIGG

*Attesting Officer*

*Commissioner of Patents and Trademarks*